(12) United States Patent
Fukami

(10) Patent No.: US 7,095,625 B2
(45) Date of Patent: Aug. 22, 2006

(54) ELECTRONIC COMPONENT MOUNTING CIRCUIT BOARD AND ELECTRONIC COMPONENT REPLACING METHOD

(75) Inventor: Kentaro Fukami, Iwatsuki (JP)

(73) Assignee: Fuji Xerox Co., Ltd, Tokyo (JP)

( * ) Notice: Subject to any disclaimer, the term of this patent is extended or adjusted under 35 U.S.C. 154(b) by 198 days.

(21) Appl. No.: 10/384,715

(22) Filed: Mar. 11, 2003

(65) Prior Publication Data

US 2004/0047138 A1  Mar. 11, 2004

(30) Foreign Application Priority Data

Sep. 10, 2002  (JP) ............................. 2002-264101

(51) Int. Cl.
  *H05K 7/10* (2006.01)
  *H05K 7/02* (2006.01)
(52) U.S. Cl. ...................... 361/808; 361/760
(58) Field of Classification Search ................ 361/760, 361/777, 778, 782, 807, 767, 808; 174/250, 174/261, 262
  See application file for complete search history.

(56) References Cited

U.S. PATENT DOCUMENTS

| | | | |
|---|---|---|---|
| 3,411,042 A * | 11/1968 | Klein | 361/636 |
| 5,184,284 A * | 2/1993 | Ashelin et al. | 361/783 |
| 5,231,560 A * | 7/1993 | Page et al. | 361/760 |
| 5,420,377 A * | 5/1995 | Bresin et al. | 174/263 |
| 5,726,862 A * | 3/1998 | Huynh et al. | 361/773 |
| 5,742,486 A * | 4/1998 | Yangkuai | 361/807 |
| 5,805,423 A * | 9/1998 | Wever et al. | 361/760 |
| 5,842,275 A * | 12/1998 | McMillan et al. | 29/840 |
| 5,909,011 A * | 6/1999 | Chartrand et al. | 174/261 |
| 5,920,462 A * | 7/1999 | Glovatsky et al. | 361/760 |
| 6,362,436 B1 * | 3/2002 | Kimbara et al. | 174/260 |
| 6,388,203 B1 * | 5/2002 | Rinne et al. | 174/261 |
| 6,799,980 B1 * | 10/2004 | Bloomfield et al. | 439/92 |
| 2004/0227670 A1 * | 11/2004 | Higasa | 343/700 MS |

* cited by examiner

*Primary Examiner*—Kamand Cuneo
*Assistant Examiner*—Yuriy Semenenko
(74) *Attorney, Agent, or Firm*—Oliff & Berridge, PLC

(57) ABSTRACT

An electronic component mounting circuit board for mounting an electronic component, comprises a circuit board, and connection pads provided on the circuit board, the connection pads being formed with a plurality of holes for inserting terminals of the electronic component.

10 Claims, 5 Drawing Sheets

ELECTRONIC COMPONENT MOUNTING CIRCUIT BOARD AND ELECTRONIC COMPONENT REPLACING METHOD

BACKGROUND OF THE INVENTION

1. Field of the Invention

The present invention relates to an electronic component mounting circuit board and an electronic component replacing method, and particularly to an electronic component mounting circuit board and an electronic component replacing method which facilitate the operations of removing mounted electronic components and mounting new electronic components.

2. Description of the Related Art

An electronic component mounting circuit board for mounting various electronic components on a circuit board on which a circuit is formed is used in various electric products such as office automation (OA) machines.

In such an electronic component mounting circuit board, electronic components, which must be replaced after a certain period of time, such as a battery serving as a backup power supply for a DRAM or an SRAM are mounted if necessary.

To facilitate the replacement of these electronic components, a method has been used in which a connector is provided on the circuit board, and an electronic component such as a battery is connected with the connector without being directly mounted on the circuit board.

Recently, recycling of home electric appliances and the like has been attracting attention, and attempts have been made by makers and mass merchandisers of home electric appliances to collect electric products such as OA machines from users, conduct maintenance and necessary repairs to the collected products, and return them to the market.

To perform the recycling of electric products, it is necessary to replace electronic components such as capacitors and batteries which have degraded as the products are being used.

Such electronic components are often mounted on a circuit board with soldering. Therefore, to replace these electric components, it is necessary to remove solder applied to contacts between the electronic components and the circuit board, which requires a large amount of labor and time.

In the conventional method in which sockets or connectors are provided for mounting the electronic components on the circuit board, cost for the sockets or the connectors, and at the same time, holders for holding a battery and the like connected with the connector is required, which causes additional cost for such components.

Further, in the conventional method, it is necessary to secure an area for mounting the holder, which is larger than that of the battery to be held, in addition to the required cost of the holder.

SUMMARY OF THE INVENTION

The present invention has been made in view of the above circumstances, and provides an electronic component mounting circuit board and an electronic component replacing method, which can replace electronic components easily and at a low cost.

In one aspect of the present invention, an electronic component mounting circuit board for mounting electronic components comprises a circuit board; and connection pad provided on the circuit board, the connection pad being formed with a plurality of holes for inserting terminals of the electronic component.

With this configuration, since terminals of a new electronic component to be newly connected can be inserted into and connected with unused holes, it is possible to cut the terminals of a mounted electronic component for removing it.

In another aspect of the present invention, an electronic component replacing method of replacing an electronic component mounted on an electronic component mounting circuit board by means of connection pads having a plurality of holes provided on the mounting circuit board, comprising the steps of cutting terminals of the electronic component connected with holes of the connection pads, so as to remove the electronic component from the connection pads; and inserting terminals of a new electronic component into unused holes formed in the connection pads with the holes having the remaining cut terminals, thereby mounting the electronic component.

With this configuration, since a mounted electronic component is removed by cutting its terminals, it is possible to largely reduce the time for the removal compared with that in the method of removing solder. In addition, since it is not necessary to apply heat, it is possible to prevent the circuit board and other electronic components from being damaged due to the applied heat.

BRIEF DESCRIPTION OF THE DRAWINGS

Preferred embodiments of the present invention will be described in detail based on the following drawings, wherein.

DESCRIPTION OF THE EMBODIMENTS

The following section details embodiments of a circuit board for mounting electronic components and a method of replacing an electronic component according to the present invention while referring to accompanying drawings.

Figure 1:
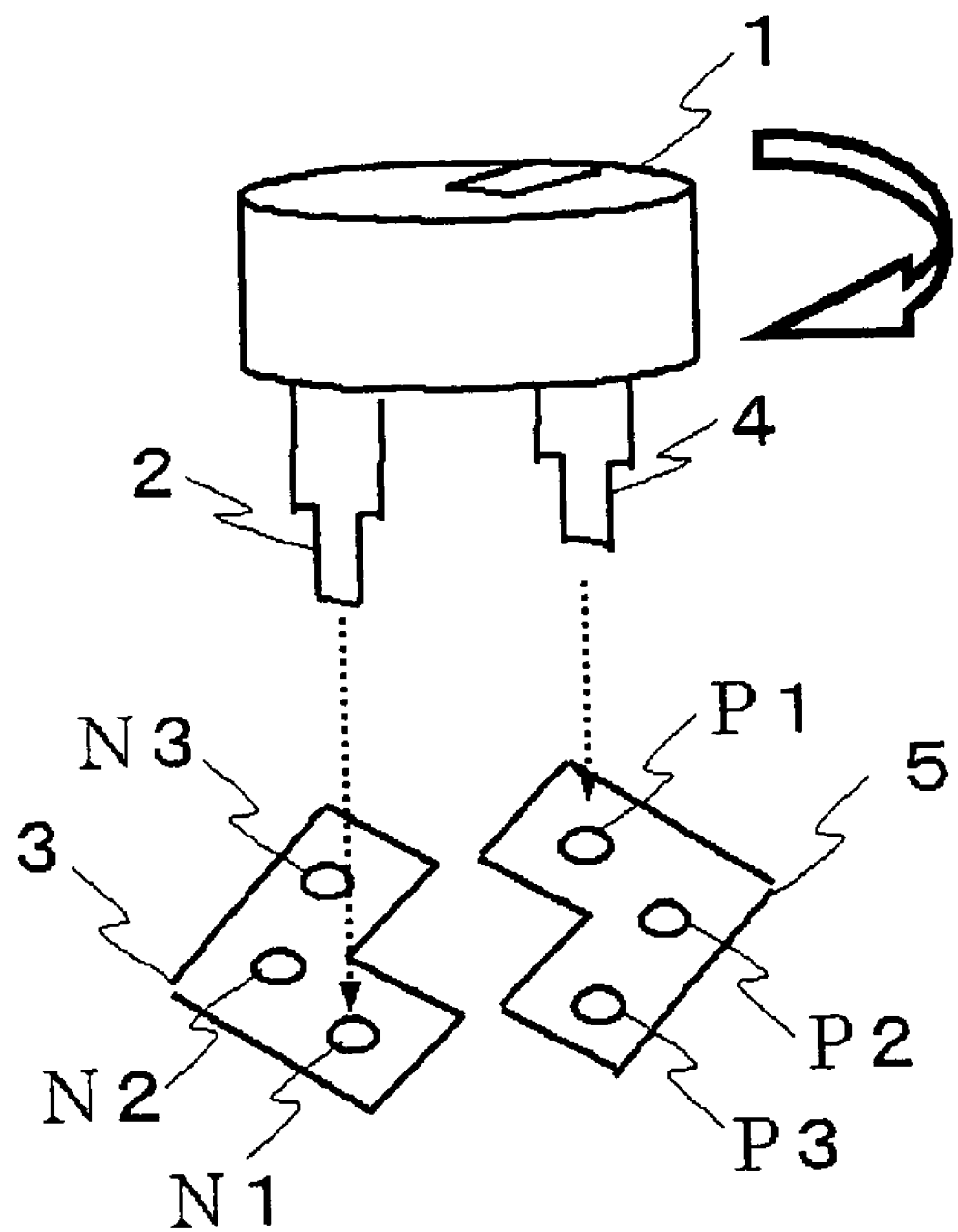
FIG. 1 is a schematic view showing an example of the configuration of connection pads provided on an electronic component mounting circuit board according to a first embodiment of the present invention.

FIG. 1 is a schematic perspective view showing an example of the configuration of a connection pad on the electronic component mounting circuit board according to the first embodiment of the present invention, in which a circuit board mounting type cylindrical battery 1 is used as an example of the electronic component.

Referring to FIG. 1, a plurality of holes N (three holes N1 through N3 in this embodiment) are formed in a negative terminal connection pad 3. A negative terminal 2 of the battery 1 is inserted and soldered in the hole N1 to connect the battery 1 with the connection pad 3.

A plurality of holes P (three holes P1 through P3 in this embodiment) are formed in a positive terminal connection pad 5. A positive terminal 4 of the battery 1 is inserted and soldered in the hole P1 to connect the resistor 11 with the connection pad 5.

The individual holes in the negative terminal and the positive terminal are arranged at positions where the distances between the associated holes simultaneously used for mounting the electronic component (N1 and P1, N2 and P2, and N3 and P3 in FIG. 1) are equal.

The holes are configured such that the electronic component can be mounted using any one of the pairs of the associated holes (N1 and P1, N2 and P2, and N3 and P3 in FIG. 1) by rotating the electronic component on the mounting circuit board.

In FIG. 1, three holes are formed in the negative terminal pad and the positive terminal pad so as to replace the electronic component twice using the electronic component replacing method according to the present invention. However, the number of the holes is properly selected according to the type of the electronic component to be mounted, the useful life thereof, and so on.

It is preferable that the holes used for replacing the electronic component are not a through hole structure. With this construction, it is not necessary to use a solder mask when a component is replaced, and it is possible to easily mount a new electronic component even if various electronic components are mounted on the mounting circuit board.

Referring now to FIG. 2, the electronic component replacing method according to the first embodiment of the present invention is described.

Figure 2A:
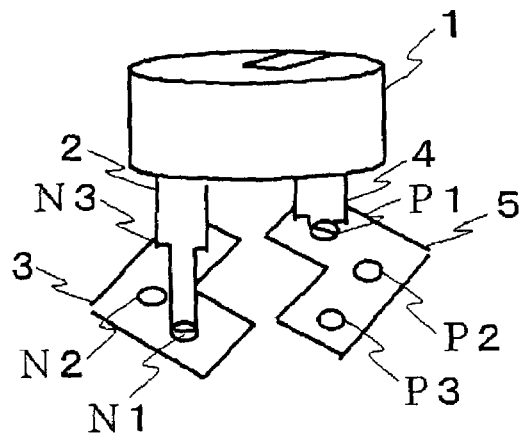
FIGS. 2A through 2C are schematic views showing a method of replacing an electronic component according to the first embodiment.

First, as shown in FIG. 2A, a negative terminal 2 and a positive terminal 4 of a battery 1 that has been mounted on a mounting circuit board (not shown) using a hole N1 in a negative terminal connection pad 3 and a hole P1 in a positive terminal connection pad 5 are cut.

Figure 2B:
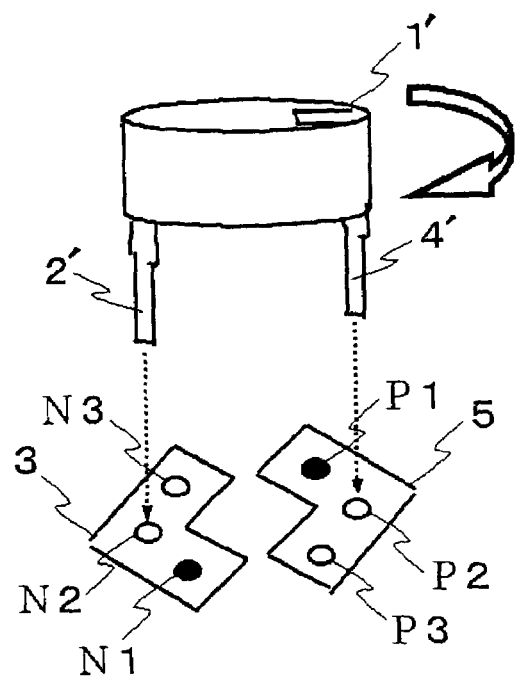
Figure 2C:
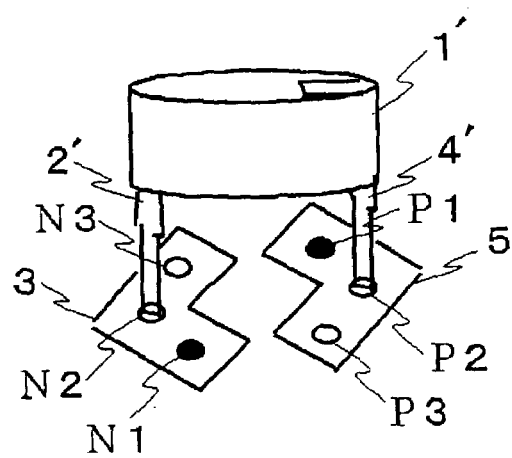

Then, a new battery 1' to be mounted on the mounting circuit board is rotated in a direction as shown in FIG. 2B, terminals 2' and 4' of the new battery 1' are inserted into unused holes N2 and P2 in which solder or a terminal leftover does not exist, and are soldered. Thus, the new battery 2' is mounted on the mounting circuit board as shown in FIG. 2C

As described above, according to the first embodiment, since terminals connected with connection pads on the circuit board are cut without removing solder to remove the electronic component from the circuit board, it is possible to largely reduce the number of processes, the time, and the labor relating to the removal of the electronic component.

In addition, since new holes are used to mount a new electronic component, that is, without using the holes already used, it is possible to replace an electronic component mounted on a mounting circuit board easily in a short period of time.

With this configuration, an electronic component is removed by cutting connection terminals, and therefore it is possible to easily recognize the number of the times of the replacement from the number of holes in which a leftover of the connection terminals remains, and to recognize how many years the mounting circuit board has been used if the component is replaced periodically. Also, in mounting an electronic component having a cylindrical shape and of radial lead type such as a cylindrical battery used in the this embodiment, a new electronic component can be positioned only by rotating the component. Therefore, when the electronic component is replaced, it is not necessary to secure a new space for mounting the new electronic component, and it is possible to minimize the area for mounting the electronic component.

For an electronic component that is of a square shape and radial lead type, and is rotated for mounting, a new electronic component requires only a circle area for mounting having a diameter corresponding to the diagonal line of the square electronic component. Therefore, the mounting area for the electronic component can be minimized.

In addition, since an electronic component is mounted on a mounting circuit board by means of connection pads, it is not necessary to use a connector or the like for holding the electronic component as in a conventional circuit board where an electronic component is mounted using a connector. As a result, electronic components can be mounted at a low cost and with a reduced space.

The present invention is also applicable to replacing an electronic component of axial lead type such as a resistor. The following section details this configuration as a second embodiment while referring to the accompanying drawings.

Figure 3:
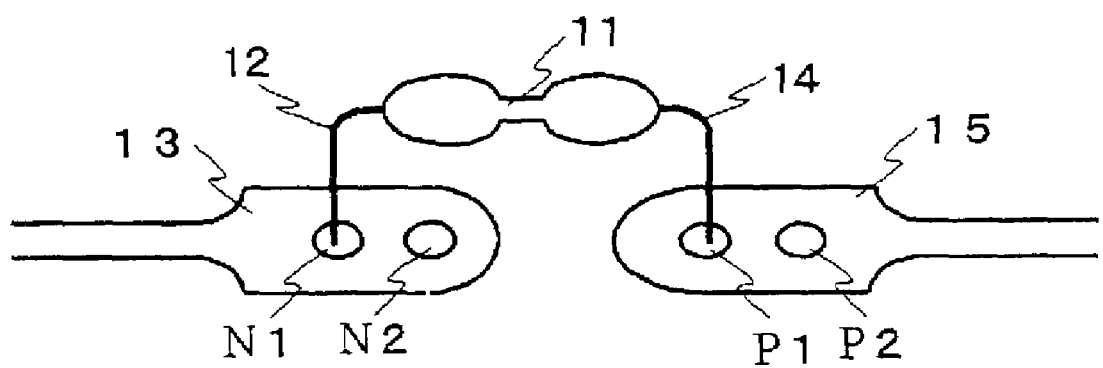
FIG. 3 is a schematic view showing an example of the configuration of connection pads provided on an electronic component mounting circuit board according to a second embodiment of the present invention.

FIG. 3 is a perspective view showing an example of the configuration of connection pads provided on an electronic component mounting circuit board according to a second embodiment of the present invention, in which an axial lead type resistor 11 is used as an example of the electronic component.

Referring to FIG. 3. a plurality of holes N (two holes N1 and N2 in this embodiment) are formed in a negative terminal connection pad 13. A negative terminal 12 of the resistor 11 is inserted and soldered in the hole N1 to connect the resistor 11 with the connection pad 13.

A plurality of holes P (two holes P1 and P2 in this embodiment) are formed in a positive terminal connection pad 15. A positive terminal 14 of the resistor 11 is inserted and soldered in the hole P1 to connect the resistor 11 with the connection pad 15.

The individual holes in the negative terminal and the positive terminal are arranged at positions where the distances between the associated holes simultaneously used for mounting an electronic component (N1 and P1, and N2 and P2 in FIG. 3) are equal.

The holes are configured such that the electronic component can be mounted using any one of the pairs of the associated holes (N1 and P1, and N2 and P2 in FIG. 3) by laterally shifting the electronic component on the mounting circuit board.

The following section describes the electronic component replacing method according to the second embodiment while referring to FIG. 4.

Figure 4A:
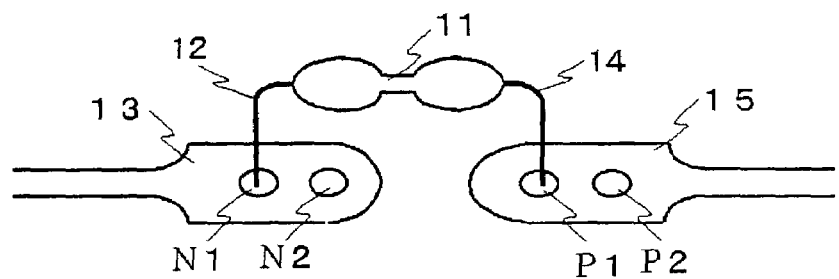
FIGS. 4A through 4C are schematic views showing a method of replacing an electronic component according to the second embodiment.

Referring first to FIG. 4A, a negative terminal 12 and a positive terminal 14 of a resistor 11 mounted on a mounting circuit board (not shown) using a hole N1 in a negative terminal connection pad 13 and a hole P1 in a positive terminal connection pad 15 are cut.

Figure 4B:
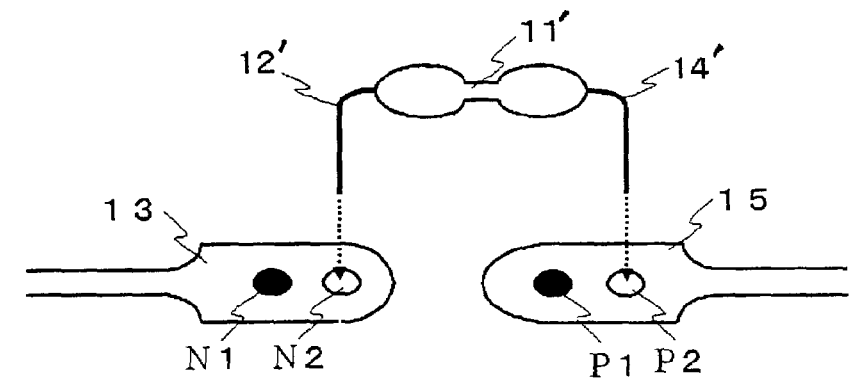
Figure 4C:
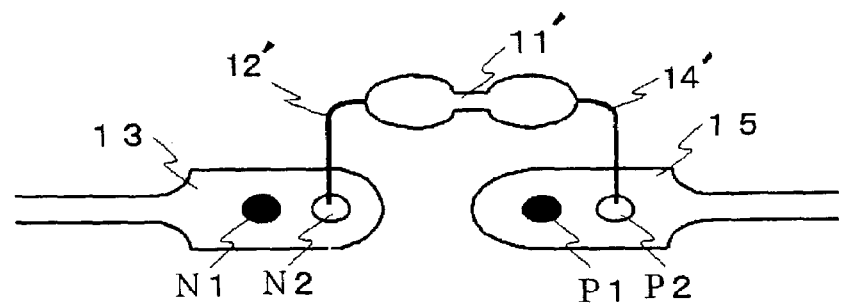

Then, a new resistor 11' to be newly mounted on the mounting circuit board is laterally shifted as shown in FIG. 4B, terminals 12' and 14' of the resistor 11' to be newly mounted are inserted into unused holes N2 and P2 in which solder or a terminal leftover does not exist, and are soldered, and the new resistor is mounted on the mounting circuit board as shown in FIG. 4C.

Since an area for the removed electronic component (an area between N1 and P1) and an area for the newly mounted electronic component (an area between N2 and P2) overlap each other, the wasteful use of space in the mounting circuit board is reduced.

Figure 5A:
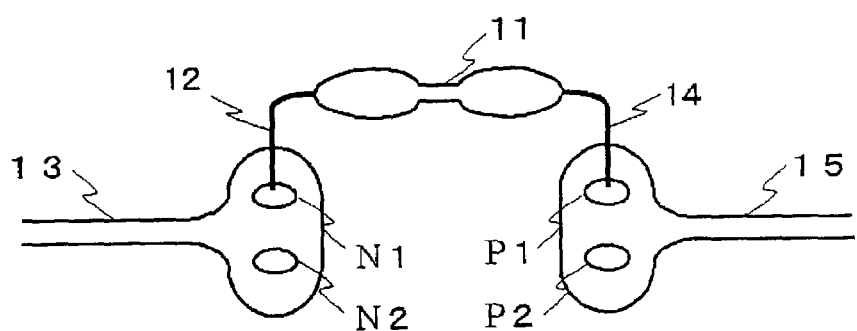
FIGS. 5A and 5B are schematic views showing another example of a method of replacing an electronic component according to the second embodiment.
Figure 5B:
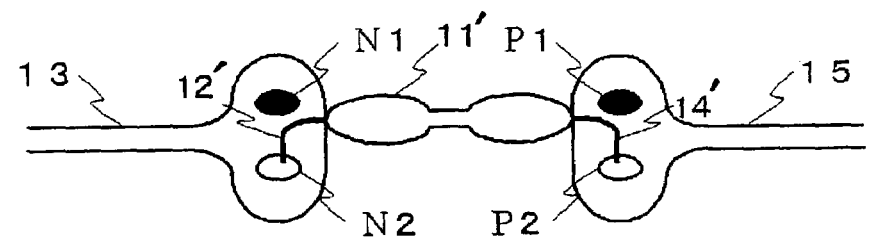

While in the this embodiment, holes for connecting terminals of a new electronic component are formed by shifting in parallel with respect to lead wires connected with connection pads, the holes may be formed by shifting vertically with respect to the lead wires as necessary as shown in FIG. 5.

As described above, since a new electronic component is mounted by shifting in parallel when an electronic component is replaced in the present invention, it is possible to restrain a new space to be secured for mounting the new component, thereby minimizing the mounting area for the electronic component.

What is claimed is:

1. An electronic component mounting circuit board for mounting an electronic component, comprising:
   a circuit board; and
   a plurality of connection pads provided on the circuit board, each of the connection pads including a plurality of holes,
   wherein a terminal of the electronic component is inserted into a hole of one of the connection pads and another terminal of the electronic component is inserted into a hole of another of the connection pads.

2. The electronic component mounting circuit board according to claim 1, wherein the holes are formed at such positions that the electronic component can be mounted in the circuit board using a different combination of the holes by a rotation thereof.

3. The electronic component mounting circuit board according to claim 1, wherein the holes are formed at such positions that the electronic component can be mounted in the circuit board using a different combination of the holes for mounting the electronic component aligned by a shift in parallel thereof.

4. The circuit board of claim 1, wherein the plurality of holes is arranged to correspond to locations of the terminals of the electronic component, when the electronic component is displaced from a nominal position.

5. The circuit board of claim 1, wherein the displacement is a rotation.

6. The circuit board of claim 1, wherein the displacement is a translation.

7. An electronic component replacing method of replacing an electronic component mounted on an electronic component mounting circuit board via a plurality of connection pads provided on the mounting circuit board, each of the connection pads including a plurality of holes, comprising the steps of:
   cutting terminals of the electronic component connected with holes of the connection pads, so as to remove the electronic component from the connection pads; and
   inserting terminals of a new electronic component into unused holes formed in the connection pads having the holes with the cut terminals remaining therein, a terminal of the new electronic component being inserted into a hole of one of the connection pads and another terminal of the electronic component being inserted into a hole of another of the connection pads, thereby mounting the electronic component.

8. The electronic component replacing method according to claim 7, wherein the new electronic component is of radial lead type and the terminals of the new electronic component to be newly mounted is inserted into and connected with the unused holes located at positions to which the terminals of the removed electronic component can be aligned by rotating.

9. The electronic component replacing method according to claim 7, wherein the new electronic is of axial type and the terminals of the new component to be newly mounted is inserted into and connected with the unused holes located at positions to which the terminals of the removed electronic component can be aligned by shifting in parallel.

10. The electronic component replacing method according to claim 7, wherein the new electronic component to be newly mounted is inserted into and connected with the unused holes located at positions where the area of the new electronic component and the area of the removed electronic component overlap with each other.

* * * * *